US012334931B2

United States Patent
Hung et al.

(10) Patent No.: US 12,334,931 B2
(45) Date of Patent: Jun. 17, 2025

(54) SIGNAL CONVERSION DEVICE AND CIRCUIT SYSTEM USING THE SAME

(71) Applicant: NUVOTON TECHNOLOGY CORPORATION, Hsinchu (TW)

(72) Inventors: Yeh-Tai Hung, Zhubei (TW); Ching-Yen Chiu, Zhubei (TW); Chung Ming Hsieh, Zhubei (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 75 days.

(21) Appl. No.: 18/524,364

(22) Filed: Nov. 30, 2023

(65) Prior Publication Data

US 2025/0030409 A1 Jan. 23, 2025

(30) Foreign Application Priority Data

Jul. 20, 2023 (TW) ................. 112127012

(51) Int. Cl.
*H03K 5/01* (2006.01)
(52) U.S. Cl.
CPC ...................... *H03K 5/01* (2013.01)
(58) Field of Classification Search
None
See application file for complete search history.

(56) References Cited

U.S. PATENT DOCUMENTS

| 5,805,019 A * | 9/1998 | Shin ........................ H03F 3/005 |
| | | 330/86 |
| 12,176,914 B2 * | 12/2024 | Hung ...................... H03M 1/38 |
| 2023/0299787 A1 * | 9/2023 | Chang .................... H03M 3/462 |
| | | 341/143 |

* cited by examiner

*Primary Examiner* — Cassandra F Cox (74) *Attorney, Agent, or Firm* — MUNCY, GEISSLER, OLDS & LOWE, P.C.

(57) ABSTRACT

A signal conversion device for converting a single-ended input voltage into a differential input voltage having a positive input voltage and a negative input voltage is provided. During a sampling phase, a holding phase, and a common-mode voltage generation phase, a capacitor related to the positive input voltage is electrically connected to the single-ended input voltage, and a capacitor related to the negative input voltage is electrically connected to a preset voltage. During a single-ended to differential phase, the capacitor related to the positive input voltage is electrically connected to the preset voltage, and the capacitor related to the negative input voltage is electrically connected to the single-ended input voltage. Hence, the common-mode voltage is not related to a capacitance ratio, and the capacitors does not need to be designed as switching capacitors with multiple switches. No complex control is required, and the parasitic effect of the circuit can be reduced.

18 Claims, 7 Drawing Sheets

FIG. 1

(Prior Art)

SIGNAL CONVERSION DEVICE AND CIRCUIT SYSTEM USING THE SAME

CROSS-REFERENCE TO RELATED APPLICATION

This application claims the priority benefit of Taiwan application serial no. 112127012, filed Jul. 20, 2023, the full disclosure of which is incorporated herein by reference.

BACKGROUND

Technical Field

The disclosure relates to a signal conversion device for converting a single-ended input voltage into a differential input voltage and a circuit system using the same. More particularly, the disclosure relates to a signal conversion device and a circuit system where the common-mode voltage is unrelated to the capacitance value ratio and is equal to half of the system voltage.

Description of Related Art

Figure 1:
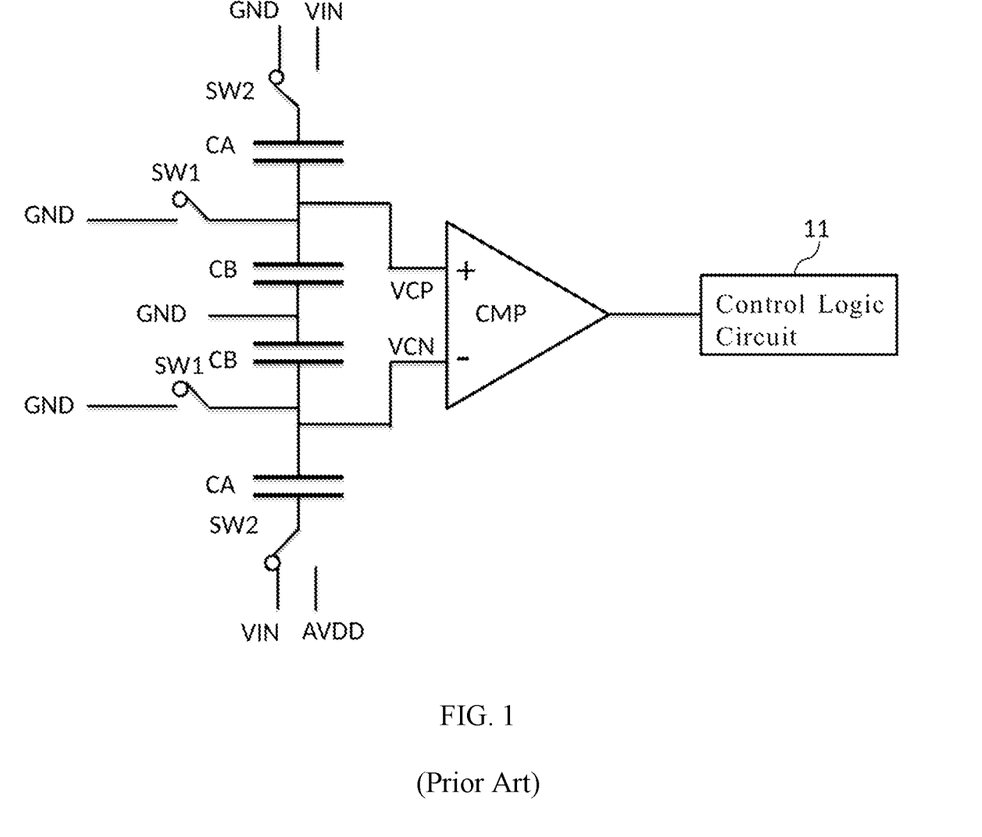
FIG. 1 is a circuit diagram of a signal conversion device in the prior art.

Referring to FIG. 1, FIG. 1 is a circuit diagram of a signal conversion device in the prior art. The signal conversion device in the prior art includes multiple switches SW1, SW2, an operational amplifier CMP, multiple capacitors CA, CB, and a control logic circuit 11. One of the switches SW2 toggles to connect the capacitor CA to the single-ended input voltage VIN or the ground voltage GND, and another switch of the multiple switches SW2 toggles to connect the capacitor CA to the single-ended input voltage VIN or the system voltage AVDD. Switch SW1 toggles to connect the junction of capacitors CB and CA to the ground voltage. Thus, the signal conversion device in the prior art generates a differential input voltage with positive input voltage VCP and negative input voltage VCN.

By using a signal conversion device of the prior art, a single-ended input voltage VIN is converted into a differential input voltage. The common-mode voltage of the differential input voltage is 1/N of the single-ended input voltage VIN (i.e., VIN/N), and the differential input voltage is 2/N of the single-ended input voltage VIN minus 1/N of the system voltage AVDD (i.e., 2VIN/N−AVDD/N), where 1/N is the capacitance ratio between the capacitance value of capacitor CA and the total capacitance value of capacitors CA and CB (i.e., 1/N=CA/(CA+CB)). It is evident that the common-mode voltage is related to 1/N, and for different system voltages AVDD, it is necessary to adjust 1/N. Therefore, capacitors CA and CB are designed as switching capacitors and have multiple switches. Through control logic circuit 11, the switches of the switching capacitors are controlled to select the appropriate 1/N. In simple terms, the prior art method requires complex logic control, and the design of the switching capacitors can adversely affect the performance of the overall signal conversion device due to parasitic effects on the circuit.

SUMMARY

It can be understood from the above description that the present invention is to solve the technical problems of the prior art related to the ratio of common mode voltage to capacitance value and the capacitor needs to be designed as a switching capacitor, which requires complex logic control and produces parasitic line effects.

For resolving the aforementioned prior art problems, embodiments of the present invention provide a signal conversion device. The signal conversion device is used to convert a single-ended input voltage into a differential input voltage having a positive input voltage and a negative input voltage. The signal conversion device comprises a first voltage selector for selecting either the single-ended input voltage or a preset voltage as a first voltage output at a first terminal of the first voltage selector. A second voltage selector for selecting either the single-ended input voltage or the preset voltage as a second voltage output at a second terminal of the second voltage selector, wherein the first voltage is different from the second voltage. A third voltage selector for selecting a system voltage or a ground voltage as a third voltage output at a third terminal of the third voltage selector. A system voltage equalizer having a fourth terminal and a fifth terminal, for selectively electrically connecting the fourth terminal and the fifth terminal to the system voltage. A first capacitor electrically connected between the first terminal and the fourth terminal. A second capacitor electrically connected between the third terminal and the fourth terminal. A third capacitor electrically connected between the ground voltage and the fourth terminal. A fourth capacitor electrically connected between the second terminal and the fifth terminal. A fifth capacitor electrically connected between the third terminal and the fifth terminal. A sixth capacitor electrically connected between the ground voltage and the fifth terminal. The fourth terminal is used to output the positive input voltage in a single-ended to differential conversion phase, and the fifth terminal is used to output the negative input voltage in the single-ended to differential conversion phase.

In order to solve the above-mentioned conventional problems and achieve the above-mentioned technical effects, embodiments of the present invention provide a circuit system, which includes the above-mentioned signal conversion device and a functional circuit. The functional circuit is electrically connected to the signal conversion device and receives the differential input voltage to perform specific functions accordingly.

In summary, through the signal conversion device and the circuit system using the same provided by the embodiments of the present invention, the common mode voltage of the differential input voltage converted by the signal conversion device can be independent of the capacitance value ratio.

BRIEF DESCRIPTION OF THE DRAWINGS

In order to make the above and other aspects, features, advantages and embodiments of the present invention more clearly understandable, the accompanying drawings are described as follows.

DETAILED DESCRIPTION

To address the technical issues in the prior art, embodiments of the present invention primarily provide a signal conversion device used for converting a single-ended input voltage into a differential input voltage comprising positive and negative input voltages. The features of the signal conversion device comprise the followings. During a sampling phase, a holding phase, and a common-mode voltage generation phase, a capacitor related to the positive input voltage is electrically connected to the single-ended input voltage, and a capacitor related to the negative input voltage is electrically connected to a preset voltage. During a single-ended to differential phase, the capacitor related to the positive input voltage is electrically connected to the preset voltage, and the capacitor related to the negative input voltage is electrically connected to the single-ended input voltage. Hence, the common-mode voltage is not related to a capacitance ratio, and the capacitors does not need to be designed as switching capacitors with multiple switches. No complex control is required, and the parasitic effect of the circuit can be reduced.

On the other hand, the present invention also provides a circuit system comprising the aforementioned signal conversion device and a functional circuit. The functional circuit is electrically connected to the signal conversion device to receive the differential input voltage and perform specific functions based on it. For example, the functional circuit can be the processing circuit of a sound output device, the front-end circuit of a wireless communication device, or the signal amplification circuit of an instrument device, and the present invention is not limited to these examples.

Figure 2:
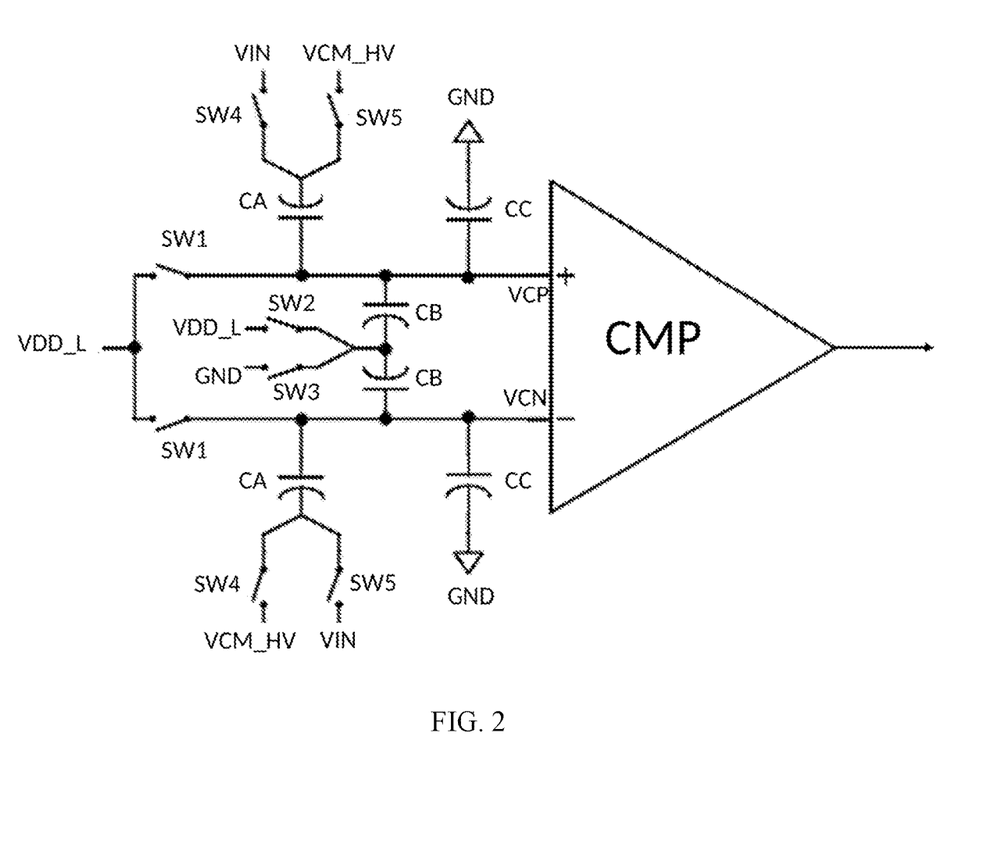
FIG. 2 is a circuit diagram of a signal conversion device according to an embodiment of the present invention.
Figure 3:
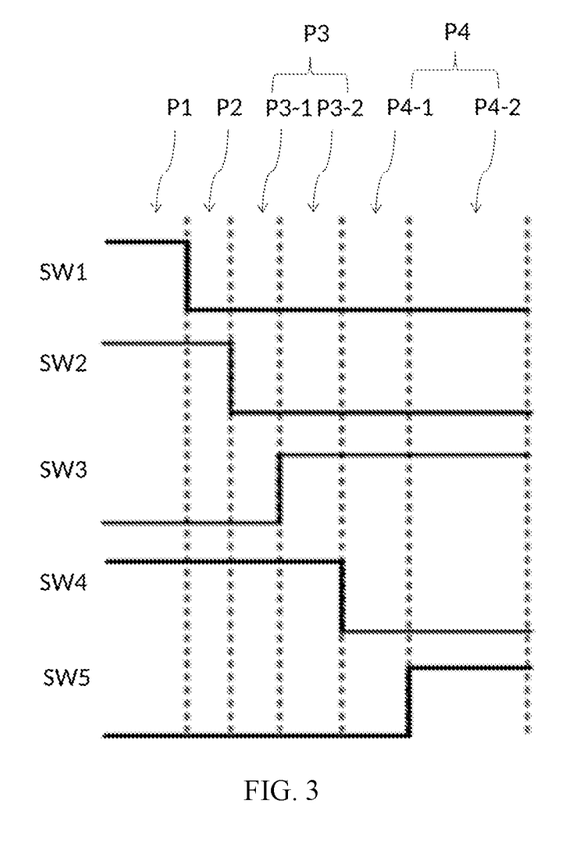
FIG. 3 is a waveform diagram of each switching signal of the signal conversion device according to an embodiment of the present invention.

Referring to FIG. 2, FIG. 2 is a circuit diagram of a signal conversion device according to an embodiment of the present invention. In FIG. 2, the signal conversion device is used to convert the single-ended input voltage VIN into a differential input voltage comprising positive input voltage VCP and negative input voltage VCN. The signal conversion device includes multiple voltage selectors, a system voltage equalizer, and multiple capacitors CA to CC. The switches SW4 and SW5 in the upper half forms one of the voltage selectors, the switches SW4 and SW5 in the lower half forms another voltage selector, switches SW2 and SW3 form yet another voltage selector, and two switches SW1 form the system voltage equalizer. It is worth noting that the signal conversion device can also comprise an operational amplifier CMP, although the operational amplifier CMP is not a necessary component of the signal conversion device.

The voltage selector formed by the switches SW4 and SW5 in the upper half is used to choose the single-ended input voltage VIN or the preset voltage VCM_HV as the selected voltage output, connected to one end of the capacitor CA in the upper half. The voltage selector formed by the switches SW4 and SW5 in the lower half is used to choose the single-ended input voltage VIN or the preset voltage VCM_HV as the selected voltage output at one end connected to the capacitor CA in the lower half. The voltage selector formed by switches SW2 and SW3 is used to choose the system voltage VDD_L or the ground voltage GND as the selected voltage output at one end connected to the two capacitors CB. Please noted that in this embodiment, the low voltage-system voltage VDD_L is used as an example, but the present invention is not limited to this. Furthermore, the input terminal of switch SW2 is electrically connected to the system voltage VDD_L and the input terminal of switch SW3 is electrically connected to the ground voltage GND. Switch SW2 is controlled by the second switching signal to be closed or opened, and SW3 is controlled by the third switching signal to be closed or opened.

In the upper half, the input terminal of switch SW4 is electrically connected to the single-ended input voltage VIN, and input terminal of switch SW5 is electrically connected to the preset voltage VCM_HV. In the lower half, the input terminal of switch SW4 is electrically connected to the preset voltage VCM_HV, and the input terminal of switch SW5 is electrically connected to the single-ended input voltage VIN. Therefore, the selection voltage received by one end of the capacitor CA in the upper half will be different from the selection voltage received by one end of the capacitor CA in the lower half. Further, the switch SW4 is controlled to be closed or opened by the fourth switching signal, and the switch SW5 is controlled to be closed or opened by the fifth switching signal. When the voltage selector composed of the switches SW4 and SW5 in the upper half selects the preset voltage VCM_HV, the voltage selector composed of the switches SW4 and SW5 in the lower half will select the single-ended input voltage VIN, and vice versa.

The system voltage equalizer composed of two switches SW1 is used to selectively electrically connect the two ends connected to the positive input terminal and the negative input terminal of the operational amplifier CMP to the system voltage VDD_L. The output terminal of the switch SW1 in the upper half is electrically connected to the positive input terminal of the operational amplifier CMP, and the output terminal of the switch SW1 in the lower half is electrically connected to the negative input terminal of the operational amplifier CMP. The input terminals of the two switches SW1 are electrically connected to the system voltage VDD_L. The two switches SW1 are controlled to be closed or opened by the first switching signal. Simply put, through the control of the first switching signal, the voltages on the positive input terminal and the negative input terminal of the operational amplifier CMP are selectively equalized to the system voltage VDD_L.

The capacitor CA in the upper half is electrically connected between one end of the voltage selector composed of the switches SW4 and SW5 in the upper half and one end of the system voltage equalizer. Further, one end of the capacitor CA of the upper half is electrically connected to the output end of the switches SW4 and SW5 of the upper half, and the other end of the capacitor CA of the upper half is electrically connected to the output end of the switch SW1 of the upper half. The capacitor CB in the upper half is electrically connected between one end of the voltage selector composed of switches SW2 and SW3 and one end of the system voltage equalizer. Further, one end of the upper half capacitor CB is electrically connected to the output ends of the switches SW2 and SW3, and the other end of the upper half capacitor CB is electrically connected to the output end of the upper half switch SW1. The capacitor CC in the upper half is electrically connected between the ground voltage GND and one end of the system voltage equalizer. Further, one end of the capacitor CC in the upper half is electrically connected to the ground voltage GND, and the other end of the capacitor CC in the upper half is electrically connected to the output end of the switch SW1 in the upper half.

The capacitor CA in the lower half is electrically connected between one end of the voltage selector composed of the switches SW4 and SW5 in the lower half and the other end of the system voltage equalizer. Further, one end of the capacitor CA of the lower half is electrically connected to the output end of the switches SW4 and SW5 of the lower half, and the other end of the capacitor CA of the lower half is electrically connected to the output end of the switch SW1 of the lower half. The capacitor CB in the lower half is electrically connected between one end of the voltage selector composed of switches SW2 and SW3 and the other end of the system voltage equalizer. Further, one end of the lower half capacitor CB is electrically connected to the output ends of the switches SW2 and SW3, and the other end of the lower half capacitor CB is electrically connected to the output end of the lower half switch SW1. The capacitor CC in the lower half is electrically connected between the ground voltage GND and the other end of the system voltage equalizer. Furthermore, one end of the capacitor CC in the lower half is electrically connected to the ground voltage GND, and the other end of the capacitor CC in the lower half is electrically connected to the output end of the switch SW1 in the lower half.

In this embodiment, the capacitor CA of the upper half and the capacitor CA of the lower half have the same capacitance value, the capacitor CB of the upper half and the capacitor CB of the lower half have the same capacitance value, and the capacitor CC of the upper half and the capacitor CC of the lower half have the same capacitance value. Through the signal conversion device of the present invention, the positive input voltage VCP is half of the system voltage VDD_L plus 1/N of the preset voltage minus 1/N of the single-ended input voltage, that is, VCP=VDD_L/2+VCM_HV/N−VIN/N. The negative input voltage VCN is half the system voltage VDD_L plus 1/N of the single-ended input voltage minus 1/N of the preset voltage, that is, VCN=VDD_L/2−VCM_HV/N+VIN/N. 1/N is the capacitance value ratio of the capacitance value of capacitor CA to the total capacitance value of capacitors CA, CB, and CC, that is, 1/N=CA/(CA+CB+CC).

From the above content, it can be known that the common mode voltage of the positive input voltage VCP and the negative input voltage VCN is half of the system voltage, VDD_L/2, which has nothing to do with the capacitance value ratio. Therefore, there is no need to additionally design the capacitors CA, CB, and CC as switching capacitors, which reduces complex logic control, the number of switches, and the parasitic effects of the circuit. In addition, the differential input voltage is 2/N of the preset voltage VCM_HV minus 2/N of the single-ended input voltage VIN, that is, 2*(VCM_HV/N−VIN/N). If the preset voltage VCM_HV is selected to be half of the system voltage VDD_L, that is, VCM_HV=VDD_L/2, the differential input voltage is 1/N of the system voltage VDD_L minus 2/N of the single-ended input voltage VIN, that is, VDDL/N−2*VIN/N. Therefore, the swing range of the differential input voltage can be increased.

Figure 4:
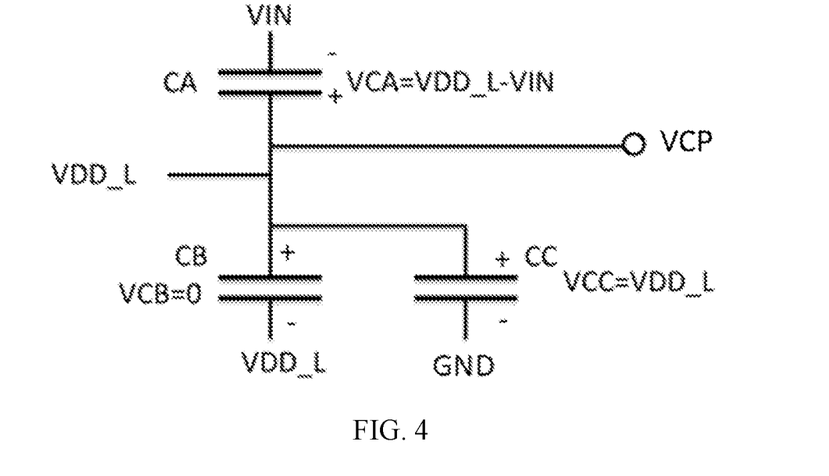
FIGS. 4 and 5 are equivalent circuit diagrams of the upper half and the lower half of the signal conversion device in the sampling phase according to an embodiment of the present invention.
Figure 5:
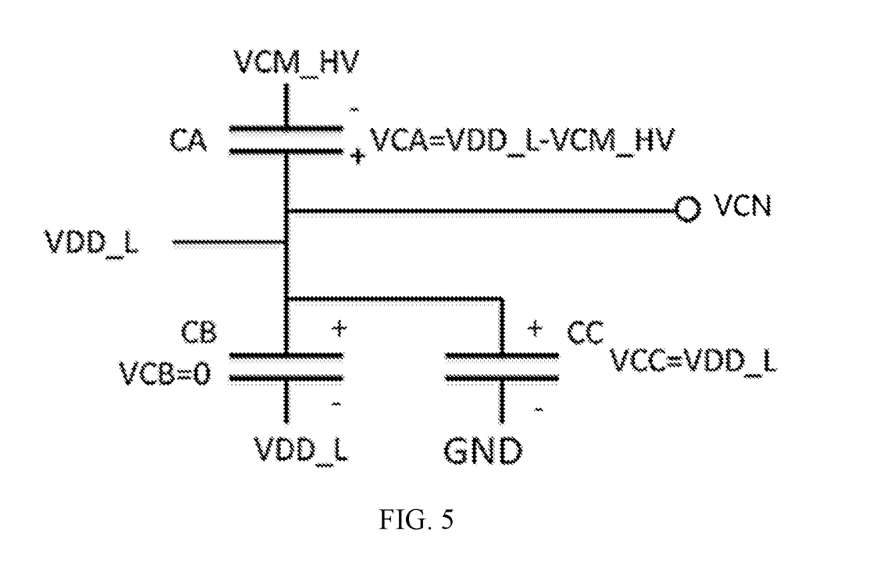

Please refer to FIG. 2, FIG. 3, FIG. 4 and FIG. 5. In the sampling phase P1, the switches SW1, SW2, and SW4 are on, while the switches SW3 and SW5 are off. The voltage selector composed of the upper half switches SW4 and SW5 selects the single-ended input voltage VIN. The voltage selector composed of the lower half switches SW4 and SW5 selects the preset voltage VCM_HV. The voltage selector composed of switches SW2 and SW3 selects the system voltage VDD_L. The system voltage equalizer equalizes one end of the positive input voltage VCP and one end of the negative input voltage VCN to the system voltage VDD_L. In this way, as shown in FIG. 4, the voltage difference across the capacitor CA in the upper half is VCA=VDD_L−VIN, the voltage difference across the capacitor CB in the upper half is VCB=0, and the voltage across the capacitor CC in the upper half is VCC=VDD_L.

Figure 6:
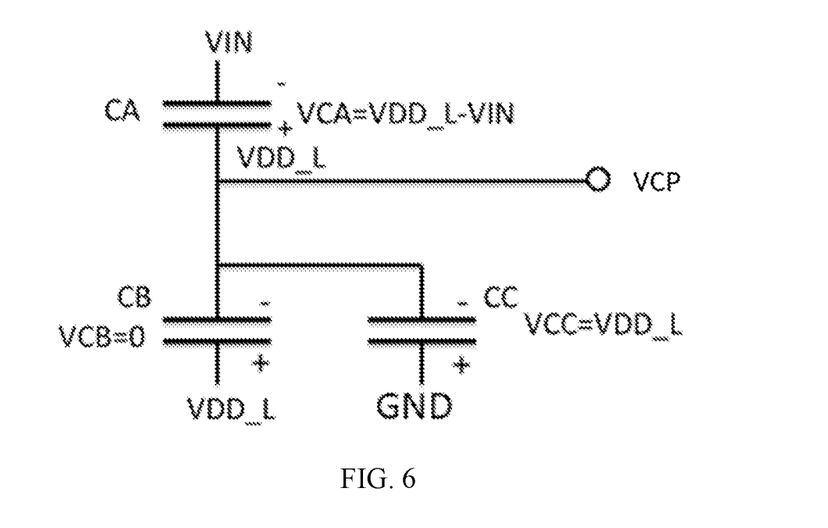
FIGS. 6 and 7 are equivalent circuit diagrams of the upper half and the lower half of the signal conversion device in the holding phase according to an embodiment of the present invention.
Figure 7:
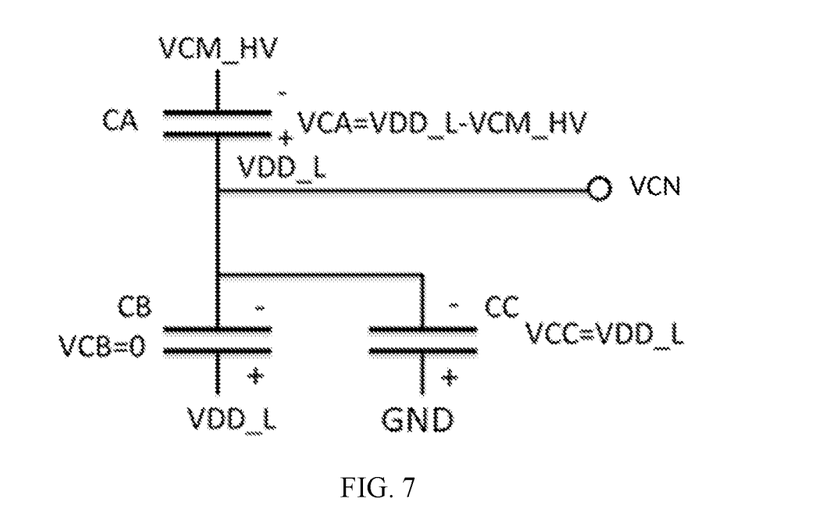

Please refer to FIG. 2, FIG. 3, FIG. 6 and FIG. 7. In the holding phase P2, switches SW2 and SW4 are turned on, while switches SW1, SW3, and SW5 are turned off. The voltage selector composed of the upper half switches SW4 and SW5 selects the single-ended input voltage VIN. The voltage selector composed of the lower half switches SW4 and SW5 selects the preset voltage VCM_HV. The voltage selector composed of switches SW2 and SW3 selects the system voltage VDD_L. The system voltage equalizer no longer equalizes one end of the positive input voltage VCP and one end of the negative input voltage VCN to the system voltage VDD_L. In this way, as shown in FIG. 6, the voltage difference across the capacitor CA in the upper half is VCA=VDD_L−VIN, the voltage difference across the capacitor CB in the upper half is VCB=0, and the voltage across the capacitor CC in the upper half is VCC=VDD_L. As shown in FIG. 7, the voltage difference across the capacitor CA in the lower half is VCA=VDD_L−VCM_HV, the voltage difference across the capacitor CB in the lower half is VCB=0, and the voltage difference across the capacitor CC in the lower half is VCC=VDD_L.

Figure 8:
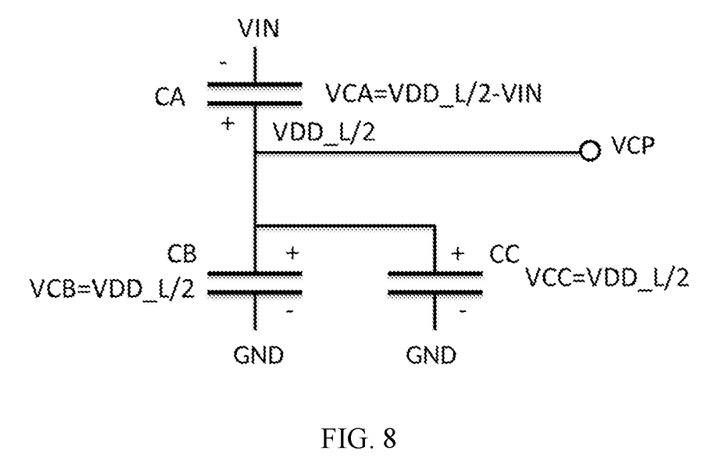
FIGS. 8 and 9 are equivalent circuit diagrams of the upper and lower halves of the signal conversion device in the common-mode voltage generation phase according to an embodiment of the present invention.
Figure 9:
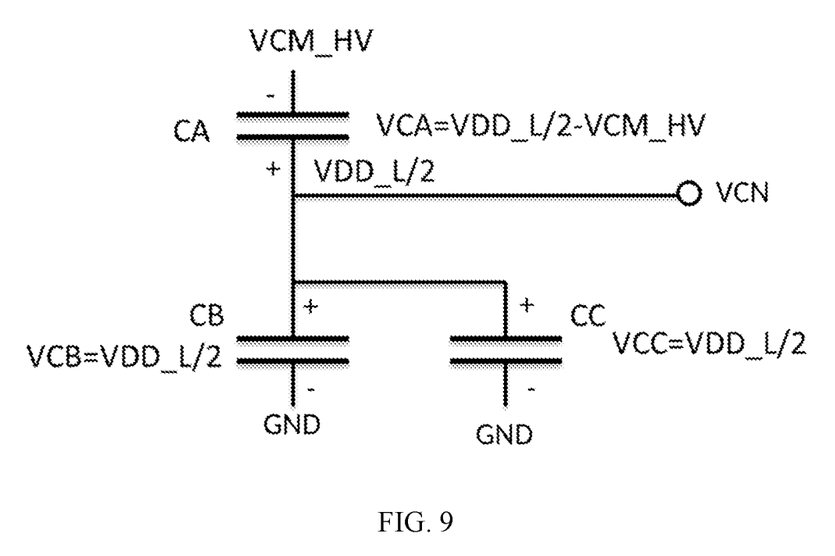

Please refer to FIG. 2, FIG. 3, FIG. 8 and FIG. 9. In the sub-phase P3-1 of the common-mode voltage generation phase P3, only the switch SW4 is turned on. In the sub-phase P3-2 of the common-mode voltage generation phase P3, only switches SW3 and SW4 are turned on. Therefore, in the sub-phase P3-2 of the common-mode voltage generation phase P3, the voltage selector composed of the upper half switches SW4 and SW5 selects the single-ended input voltage VIN. The voltage selector composed of the lower half switches SW4 and SW5 selects the preset voltage VCM_HV. The voltage selector composed of switches SW2 and SW3 selects the ground voltage GND. The system voltage equalizer no longer equalizes one end of the positive input voltage VCP and one end of the negative input voltage VCN to the system voltage VDD_L. In this way, as shown in FIG. 8, the voltage difference across the capacitor CA in the upper half is VCA=VDD_L/2−VIN, the voltage difference across the capacitor CB in the upper half is VCB=VDD_L/2, and the voltage difference across the capacitor CC in the upper half is VCB=VDD_L/2. As shown in FIG. 9, the voltage difference across the capacitor CA in the lower half is VCA=VDD_L/2−VCM_HV, the voltage difference across the capacitor CB in the lower half is VCB=VDD_L/2, and the voltage difference across the capacitor CC in the lower half is VCC=VDD_L/2.

Figure 10:
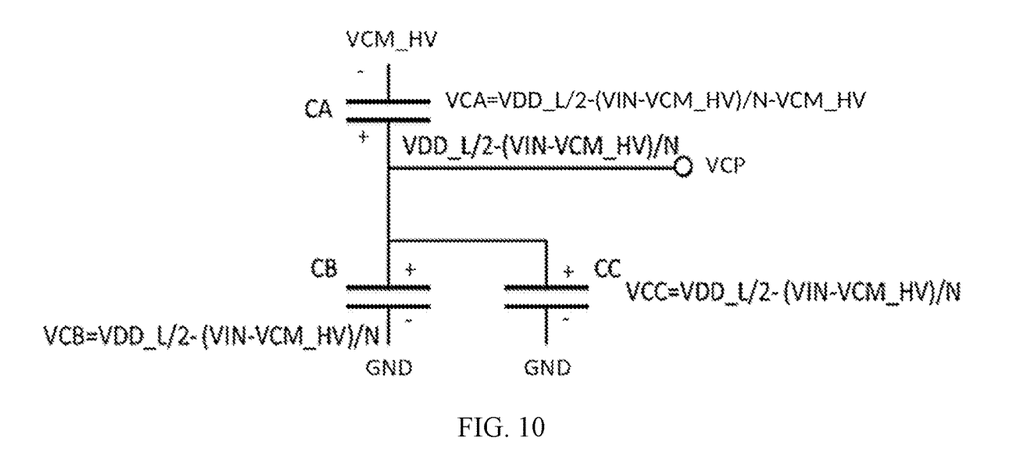
FIGS. 10 and 11 are equivalent circuit diagrams of the upper half and the lower half of the signal conversion device in the single-ended to differential phase according to an embodiment of the present invention.
Figure 11:
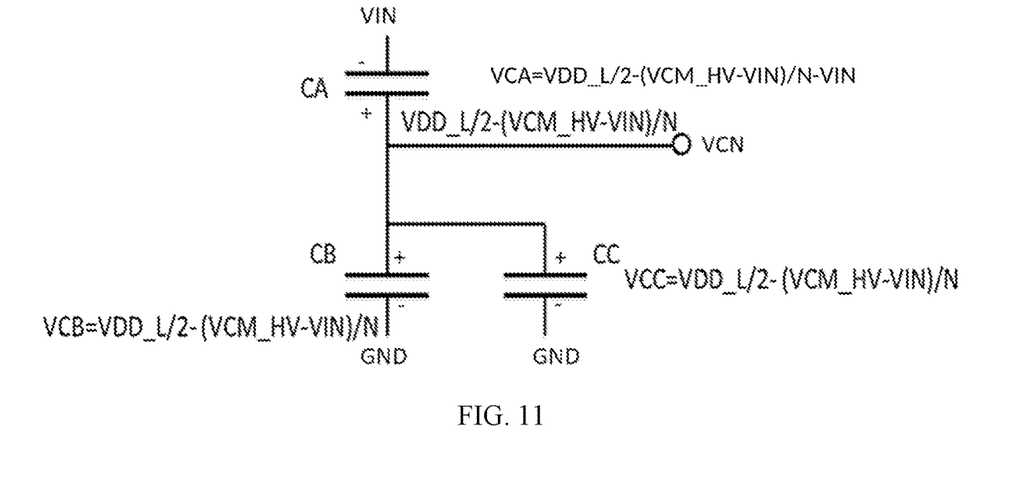

Please refer to FIG. 2, FIG. 3, FIG. 10 and FIG. 11. In the sub-phase P4-1 of the single-ended to differential phase P4, only the switch SW3 is turned on. Then in the sub-stage P4-2 of the single-ended to differential phase P4, only switches SW3 and SW5 are turned on. Therefore, in the sub-stage P4-2 of the single-ended to differential stage P4, the voltage selector composed of the upper half switches SW4 and SW5 selects the preset voltage VCM_HV. The voltage selector composed of the lower half switches SW4 and SW5 selects the single-ended input voltage VIN. The voltage selector composed of switches SW2 and SW3 selects the ground voltage GND. The system voltage equalizer no longer equalizes one end of the positive input voltage VCP and one end of the negative input voltage VCN to the system voltage VDD_L. In this way, as shown in FIG. 10, the positive input voltage VCP=VDD_L/2−(VIN−VCM_HV)/N, the voltage difference across the capacitor CA in the upper half is VCA=VDD_L/2−(VIN−VCM_HV)/N−VCM_HV, and the voltage difference across the capacitor CC in the upper half is VCB=VDD_L/2−(VIN−VCM_HV)/N. As shown in FIG. 11, the negative input voltage VCN=VDD_L/2−(VCM_HV−VIN)/N. The voltage difference across the capacitor CA in the lower half is VCA=VDD_L/2−(VCM_HV−VIN)/N−VIN, the voltage difference across the capacitor CB in the lower half is VCB=VDD_L/2−(VCM_HV−VIN)/N, and the voltage difference across the lower half of the capacitor CC is VCC=VDD_L/2−(VCM_HV−VIN)/N.

Accordingly, the signal conversion device and circuit system provided by the embodiments of the present invention achieve the technical effect of having nothing to do with the common mode voltage and the ratio of the capacitance value. Therefore, there is no need to design the capacitor as a switching capacitor, so it can reduce complex logic control, switching quantity and reduction of parasitics effects. Furthermore, the introduced preset voltage can be selected to be half of the system voltage, thereby increasing the swing range of the differential input voltage.

The present invention is disclosed in this disclosure only with preferred embodiments. However, anyone familiar with the technical field should understand that the above-mentioned embodiments are only used to describe the present invention and are not intended to limit the patent rights claimed by the protection scope of this invention. Any changes or substitutions that are equal or equivalent to the above embodiments should be construed as being within the spirit or scope of the present invention. Therefore, the protection scope of the present invention should be based on what is defined in the following patent claimed scope.

What is claimed is:

1. A signal conversion device for converting a single-ended input voltage into a differential input voltage having a positive input voltage and a negative input voltage, the signal conversion device comprising:
   a first voltage selector having a first terminal, and configured to select one of the single-ended input voltage and a preset voltage as a first voltage output at the first terminal;
   a second voltage selector having a second terminal, and configured to select one of the single-ended input voltage and the preset voltage as a second voltage output at the second terminal, wherein the first voltage is different from the second voltage;
   a third voltage selector having a third terminal, and configured to select a system voltage or a ground voltage as a third voltage output at the third terminal;
   a system voltage equalizer having a fourth terminal and a fifth terminal, and configured to selectively electrically connect the fourth terminal and the fifth terminal to the system voltage;
   a first capacitor electrically connected between the first terminal and the fourth terminal;
   a second capacitor electrically connected between the third terminal and the fourth terminal;
   a third capacitor electrically connected between the ground voltage and the fourth terminal;
   a fourth capacitor electrically connected between the second terminal and the fifth terminal;
   a fifth capacitor electrically connected between the third terminal and the fifth terminal; and
   a sixth capacitor electrically connected between the ground voltage and the fifth terminal,
   wherein the fourth terminal is used to output the positive input voltage in a single-ended to differential conversion phase, and the fifth terminal is used to output the negative input voltage in the single-ended to differential conversion phase.

2. The signal conversion device of claim 1, wherein the system voltage equalizer comprises two first switches,
   one of the two first switches comprises one input terminal electrically connected to the system voltage and one output terminal electrically connected to the fourth terminal,
   wherein the other of the two first switches comprises one input terminal electrically connected to system voltage and one output terminal electrically connected to the fifth terminal, and
   wherein the two first switches are controlled by a first switching signal to selectively electrically connect the fourth terminal and the fifth terminal to the system voltage.

3. The signal conversion device of claim 1, wherein the third voltage selector comprises a second switch and a third switch,
   wherein the second switch comprises one input terminal electrically connected to the system voltage and one output terminal electrically connected to the third terminal,
   wherein the third switch comprises one input terminal electrically connected to the ground voltage and one output terminal electrically connected to the third terminal, and
   wherein the second switch is controlled by a second switching signal to selectively electrically connect the third terminal to the system voltage, and the third switch is controlled by a third switching signal to selectively electrically connect the third terminal to the ground voltage.

4. The signal conversion device of claim 1, wherein each of the first voltage selector and the second voltage selector comprises a fourth switch and a fifth switch,
   wherein the fourth switch of the first voltage selector comprises one input terminal electrically connected to the single-ended input voltage and one output terminal electrically connected to the first terminal,
   wherein the fifth switch of the first voltage selector comprises one input terminal electrically connected to the preset voltage and one output terminal electrically connected to the first terminal,
   wherein the fourth switch of the second voltage selector comprises one input terminal electrically connected to the preset voltage and one output terminal electrically connected to the second terminal, and
   wherein the fifth switch of the second voltage selector comprises one input terminal electrically connected to the single-ended input voltage and one output terminal electrically connected to the first terminal,
   wherein the fourth switch of the first voltage selector and the fourth switch of the second voltage selector are controlled by a fourth switching signal to selectively electrically connect the single-ended input voltage to the first terminal and the preset voltage to the second terminal, respectively, and
   the fifth switch of the first voltage selector and the fifth switch of the second voltage selector are controlled by a fifth switching signal to selectively electrically connect the preset voltage to the first terminal and the single-ended input voltage to the second terminal, respectively.

5. The signal conversion device of claim 1, wherein a capacitance value of the first capacitor is equal to a capacitance value of the fourth capacitor, a capacitance value of the second capacitor is equal to a capacitance value of the fifth capacitor, and a capacitance value of the third capacitor is equal to a capacitance value of the sixth capacitor.

6. The signal conversion device of claim 1, wherein a common-mode voltage of the positive input voltage and a negative input voltage is half of the system voltage.

7. The signal conversion device of claim 5, wherein, in the single-ended to differential conversion phase, the positive input voltage is equal to half of the system voltage plus 1/N of the preset voltage minus 1/N of the single-ended input voltage, and the negative input voltage is equal to half of the system voltage plus 1/N of the single-ended input voltage minus 1/N of the preset voltage, wherein 1/N is the capacitance value ratio of the first capacitor to the total capacitance value of the first capacitor, the second capacitor, and the third capacitor.

8. The signal conversion device of claim 7, wherein the preset voltage is half of the system voltage, and the differential input voltage is equal to 1/N of the system voltage minus one-half of the single-ended input voltage.

9. The signal conversion device of claim 1, wherein
during a sampling phase, the system voltage equalizer electrically connects the fourth terminal and the fifth terminal to the system voltage, the third voltage selector selects and outputs the system voltage as the third voltage, the first voltage selector selects and outputs the single-ended input voltage as the first voltage, and the second voltage selector selects and outputs the preset voltvoltage as the second voltage;
wherein during a holding phase, the system voltage equalizer does not electrically connect the fourth terminal and the fifth terminal to the system voltage, the third voltage selector selects and outputs the system voltage as the third voltage, the first voltage selector selects and outputs the single-ended input voltage as the first voltage, and the second voltage selector selects and outputs the preset voltage as the second voltage;
wherein during a common-mode voltage generation phase, the system voltage equalizer does not electrically connect the fourth terminal and the fifth terminal to the system voltage, the third voltage selector selects and outputs the ground voltage as the third voltage, the first voltage selector selects and outputs the single-ended input voltage as the first voltage, and the second voltage selector selects and outputs the preset voltage as the second voltage; and
wherein during the single-ended to differential conversion phase, the system voltage equalizer does not electrically connect the fourth terminal and the fifth terminal to the system voltage, the third voltage selector selects and outputs the ground voltage as the third voltage, the first voltage selector selects and outputs the preset voltage as the first voltage, and the second voltage selector selects and outputs the single-ended input voltage as the second voltage.

10. A circuit system comprising:
a signal conversion device for converting a single-ended input voltage into a differential input voltage having a positive input voltage and a negative input voltage, wherein the signal conversion device comprises:
a first voltage selector having a first terminal, and configured to select one of the single-ended input voltage and a preset voltage as a first voltage output at the first terminal;
a second voltage selector having a second terminal, and configured to select one of the single-ended input voltage and the preset voltage as a second voltage output at the second terminal, wherein the first voltage is different from the second voltage;
a third voltage selector having a third terminal, and configured to select a system voltage or a ground voltage as a third voltage output at the third terminal;
a system voltage equalizer having a fourth terminal and a fifth terminal, and configured to selectively electrically connect the fourth terminal and the fifth terminal to the system voltage
a first capacitor electrically connected between the first terminal and the fourth terminal;
a second capacitor electrically connected between the third terminal and the fourth terminal;
a third capacitor electrically connected between the ground voltage and the fourth terminal;
a fourth capacitor electrically connected between the second terminal and the fifth terminal;
a fifth capacitor electrically connected between the third terminal and the fifth terminal; and
a sixth capacitor electrically connected between the ground voltage and the fifth terminal,
wherein the fourth terminal is used to output the positive input voltage in a single-ended to differential conversion phase, and the fifth terminal is used to output the negative input voltage in the single-ended to differential conversion phase; and
a functional circuit electrically connected to the signal conversion device to receive the differential input voltage and perform a specific function based on it.

11. The circuit system of claim 10, wherein the system voltage equalizer comprises two first switches,
one of the two first switches comprises one input terminal electrically connected to the system voltage and one output terminal electrically connected to the fourth terminal,
wherein the other of the two first switches comprises one input terminal electrically connected to system voltage and one output terminal electrically connected to the fifth terminal, and
wherein the two first switches are controlled by a first switching signal to selectively electrically connect the fourth terminal and the fifth terminal to the system voltage.

12. The circuit system of claim 10, wherein the third voltage selector comprises a second switch and a third switch,
wherein the second switch comprises one input terminal electrically connected to the system voltage and one output terminal electrically connected to the third terminal,
wherein the third switch comprises one input terminal electrically connected to the ground voltage and one output terminal electrically connected to the third terminal, and
wherein the second switch is controlled by a second switching signal to selectively electrically connect the third terminal to the system voltage, and the third switch is controlled by a third switching signal to selectively electrically connect the third terminal to the ground voltage.

13. The circuit system of claim 10, wherein each of the first voltage selector and the second voltage selector comprises a fourth switch and a fifth switch,
wherein the fourth switch of the first voltage selector comprises one input terminal electrically connected to the single-ended input voltage and one output terminal electrically connected to the first terminal,
wherein the fifth switch of the first voltage selector comprises one input terminal electrically connected to the preset voltage and one output terminal electrically connected to the first terminal,
wherein the fourth switch of the second voltage selector comprises one input terminal electrically connected to the preset voltage and one output terminal electrically connected to the second terminal, and
wherein the fifth switch of the second voltage selector comprises one input terminal electrically connected to the single-ended input voltage and one output terminal electrically connected to the first terminal,
wherein the fourth switch of the first voltage selector and the fourth switch of the second voltage selector being controlled by a fourth switching signal to selectively electrically connect the single-ended input voltage to the first terminal and the preset voltage to the second terminal, respectively, and
the fifth switch of the first voltage selector and the fifth switch of the second voltage selector being controlled by a fifth switching signal to selectively electrically connect the preset voltage to the first terminal and the single-ended input voltage to the second terminal, respectively.

14. The circuit system of claim 10, wherein a capacitance value of the first capacitor is equal to a capacitance value of the fourth capacitor, a capacitance value of the second capacitor is equal to a capacitance value of the fifth capacitor, and a capacitance value of the third capacitor is equal to a capacitance value of the sixth capacitor.

15. The circuit system of claim 10, wherein a common-mode voltage of the positive input voltage and a negative input voltage is half of the system voltage.

16. The circuit system of claim 14, wherein, in the single-ended to differential conversion phase, the positive input voltage is equal to half of the system voltage plus 1/N of the preset voltage minus 1/N of the single-ended input voltage, and the negative input voltage is equal to half of the system voltage plus 1/N of the single-ended input voltage minus 1/N of the preset voltage, where 1/N is the capacitance value ratio of the first capacitor to the total capacitance value of the first capacitor, the second capacitor, and the third capacitor.

17. The circuit system of claim 16, wherein the preset voltage is half of the system voltage, and the differential input voltage is equal to 1/N of the system voltage minus one-half of the single-ended input voltage.

18. The circuit system of claim 10, wherein,
during a sampling phase, the system voltage equalizer electrically connects the fourth terminal and the fifth terminal to the system voltage, the third voltage selector selects and outputs the system voltage as the third voltage, the first voltage selector selects and outputs the single-ended input voltage as the first voltage, and the second voltage selector selects and outputs the preset voltage as the second voltage;
wherein during a holding phase, the system voltage equalizer does not electrically connect the fourth terminal and the fifth terminal to the system voltage, the third voltage selector selects and outputs the system voltage as the third voltage, the first voltage selector selects and outputs the single-ended input voltage as the first voltage, and the second voltage selector selects and outputs the preset voltage as the second voltage;
wherein during a common-mode voltage generation phase, the system voltage equalizer does not electrically connect the fourth terminal and the fifth terminal to the system voltage, the third voltage selector selects and outputs the ground voltage as the third voltage, the first voltage selector selects and outputs the single-ended input voltage as the first voltage, and the second voltage selector selects and outputs the preset voltage as the second voltage; and
wherein during the single-ended to differential conversion phase, the system voltage equalizer does not electrically connect the fourth terminal and the fifth terminal to the system voltage, the third voltage selector selects and outputs the ground voltage as the third voltage, the first voltage selector selects and outputs the preset voltage as the first voltage, and the second voltage selector selects and outputs the single-ended input voltage as the second voltage.

* * * * *